(12) United States Patent
Bae

(10) Patent No.: US 7,745,266 B2
(45) Date of Patent: Jun. 29, 2010

(54) METHOD OF FORMING A FUSE PART

(75) Inventor: Se-Yeul Bae, Kyungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 33 days.

(21) Appl. No.: 11/318,637

(22) Filed: Dec. 28, 2005

(65) Prior Publication Data

US 2006/0138589 A1    Jun. 29, 2006

(30) Foreign Application Priority Data

Dec. 29, 2004    (KR) .................. 10-2004-0115190

(51) Int. Cl.
*H01L 21/82* (2006.01)
(52) U.S. Cl. .................. 438/132; 438/642; 438/661; 257/355; 257/750

(58) Field of Classification Search .................. 438/132, 438/642, 661; 257/355, 750
See application file for complete search history.

(56) References Cited

U.S. PATENT DOCUMENTS

2002/0037643 A1* 3/2002 Ishimaru .................. 438/642
2002/0100907 A1* 8/2002 Wang .......................... 257/50

* cited by examiner

*Primary Examiner*—Phuc T Dang
(74) *Attorney, Agent, or Firm*—Finnegan, Henderson, Farabow, Garrett & Dunner, L.L.P.

(57) ABSTRACT

The present invention provides a semiconductor device with a fuse part and a method of forming the same. The method includes forming a selective metal layer on a via hole which is connected to a metal line in a semiconductor device, forming a fuse metal layer on the selective metal layer, and forming a fuse metal layer pattern by using a photosensitive layer pattern which is formed on the fuse metal layer.

10 Claims, 11 Drawing Sheets

METHOD OF FORMING A FUSE PART

CROSS-REFERENCE TO RELATED APPLICATION

This application claims priority to and the benefit of Korean Patent Application No. 10-2004-0115190 filed in the Korean Intellectual Property Office on Dec. 29, 2004, the entire contents of which are incorporated herein by reference.

BACKGROUND OF THE INVENTION (a) Field of the Invention

The present invention relates to a semiconductor device with a fuse part and a method of manufacturing the same. More particularly, the present invention relates to a method of forming a fuse part in a copper line of a semiconductor device.

(b) Description of the Related Art

Generally, a spare circuit or extra circuit is formed in a semiconductor device in order to prevent defects of a semiconductor device, and when defects in a semiconductor device are found, the spare circuit or extra circuit substitutes for the defective part. In addition, a trimming process is performed so as to modify characteristics of some circuits for applicable purposes.

Such a repair or trimming process is performed by disconnecting a predetermined portion of a metal line through illumination of a laser thereon. Such a disconnection of a metal line is performed by a blowing process. A fuse refers to such a metal line that is disconnected by illumination of a laser, and a fuse part is a region where such fuses are aggregated densely.

However, a conventional method of forming a fuse part in a semiconductor device has several problems.

Firstly, when a metal layer to be used as a fuse is directly connected with a copper line which is directly connected to the metal layer, moisture created in the subsequent blowing process may penetrate into a copper line through a blowing part. Consequently, the copper line which is directly connected to the metal layer may be corroded by the moisture.

In addition, when a laser used in a blowing process attacks a copper line, a short circuit between the metal layer and the copper line may be induced.

Since the above-mentioned problems cause a failure in a PCT (Pressure Cooker Test) which is one of the subsequent reliability tests, yield of semiconductor devices may be deteriorated.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a semiconductor device with a fuse part on a copper line and a method of forming the same.

An exemplary method of forming a fuse part in a semiconductor device according to an embodiment of the present invention includes: forming a selective metal layer on a via hole which is connected to a metal line in a semiconductor device; forming a fuse metal layer on the selective metal layer; and forming a fuse metal layer pattern by using a photosensitive layer pattern which is formed on the fuse metal layer.

Another exemplary method of forming a fuse part in a semiconductor device according to an embodiment of the present invention includes: forming a first insulation layer on a metal line in a semiconductor device; forming a first photosensitive layer pattern on the first insulation layer in order to form a fuse part; etching the first insulation layer by using the first photosensitive layer pattern to a degree that the metal line is exposed; selectively forming a selective metal layer on the exposed metal line; forming a fuse metal layer on the selective metal layer; forming a fuse metal layer pattern by using a second photosensitive layer pattern which is formed on the fuse metal layer; and forming a second metal insulation layer on the fuse metal layer pattern.

The metal line may be formed by a dual damascene process, and the first insulation layer may be formed as a nitride- or oxide-based layer In addition, the selective metal layer may be composed of W, Ti, TiN, Ta, or TaN, and the fuse metal layer may be composed of Ti, TiN, Ta, or TaN.

The metal line and fuse metal layer may be connected to each other through the selective metal layer, and the selective metal layer may be formed widely enough to fully cover an interconnecting part between the metal line and the fuse metal layer.

An exemplary semiconductor device with a fuse part according to an exemplary embodiment of the present invention includes: a via hole which is connected to a metal line and composed of a metal material; a selective metal layer which is contacted with the via hole; and a fuse metal layer which is contacted with the selective metal layer so as to interconnect adjacent selective metal layers.

DETAILED DESCRIPTION OF THE EMBODIMENTS

Figure 1:
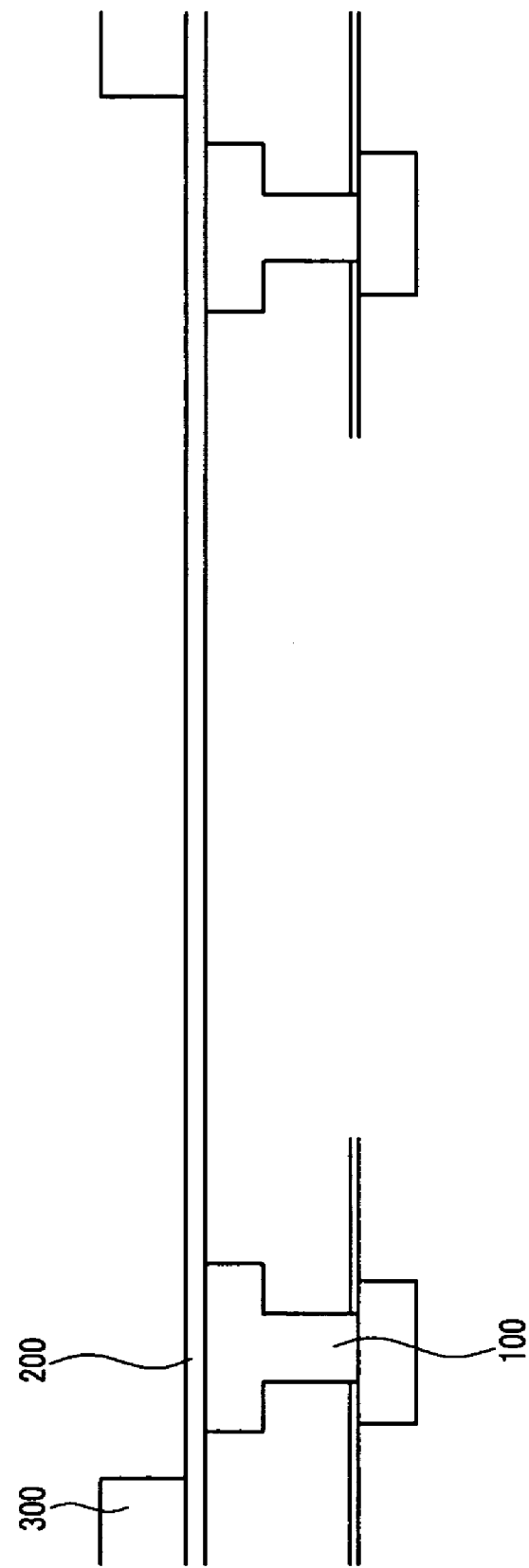
FIG. 1 to FIG. 10 are cross-sectional views showing sequential stages of forming a fuse part in a semiconductor device according to a first exemplary embodiment of the present invention.

An exemplary embodiment of the present invention will hereinafter be described in detail with reference to the accompanying drawings.

In the following detailed description, only certain exemplary embodiments of the present invention have been shown and described, simply by way of illustration. As those skilled in the art would realize, the described embodiments may be modified in various different ways, all without departing from the spirit or scope of the present invention.

To clarify multiple layers and regions, the thicknesses of the layers are enlarged in the drawings. Like reference numerals designate like elements throughout the specification. When it is said that any part, such as a layer, film, area, or plate is positioned on another part, it means the part is directly on the other part or above the other part with at least one intermediate part. On the other hand, if any part is said to be positioned directly on another part it means that there is no intermediate part between the two parts.

Hereinafter, a method of forming a fuse part in a semiconductor device according to a first exemplary embodiment of the present invention will be described in detail with reference to FIG. 1 to FIG. 10.

As shown in FIG. 1, a first insulation layer 200 is deposited on a semiconductor device including a via hole which is connected to a metal line 100. FIG. 1 is a cross-sectional view of a metal line formed by a dual damascene process.

The metal line 100 may be manufactured by various methods, but, as shown in FIG. 1, the metal line 100 is formed by a dual damascene process according to the first exemplary embodiment of the present invention.

More particularly, in order to form the metal line 100 by a dual damascene process, copper may be used as a metal material, and may fill in a trench and dual damascene pattern through an electroless or electroplating method.

The first insulation layer 200 is composed of a nitride- or oxide-based layer, and the thickness of the first insulation layer 200 may be appropriately adjusted by a person of ordinary skill in the art.

Subsequently, a photosensitive layer pattern 300 for forming a fuse part is formed on the first insulation layer 200.

Figure 2:
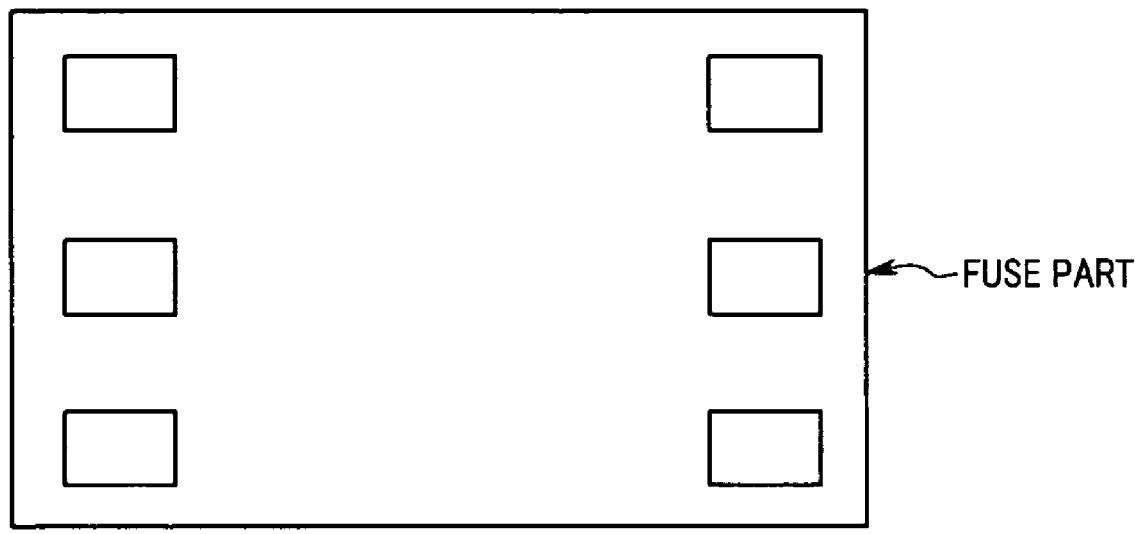

FIG. 2 is a top-plan view showing the photosensitive layer pattern 300 formed on the first insulation layer 200.

Thereafter, the first insulation layer 200 is etched by using the photosensitive layer pattern 300 as an etch mask to a degree that the metal line is exposed, and then the photosensitive layer pattern 300 is removed by an ashing process.

The etching for the first insulation layer 200 is performed by selectively using dry etching or wet etching in order to minimize etching effects on the lower metal line.

Figure 3:

FIG. 3 is a cross sectional view showing a semiconductor device after performing an etching process for the first insulation layer 200 and an ashing process for the photosensitive layer pattern 300.

Figure 4:
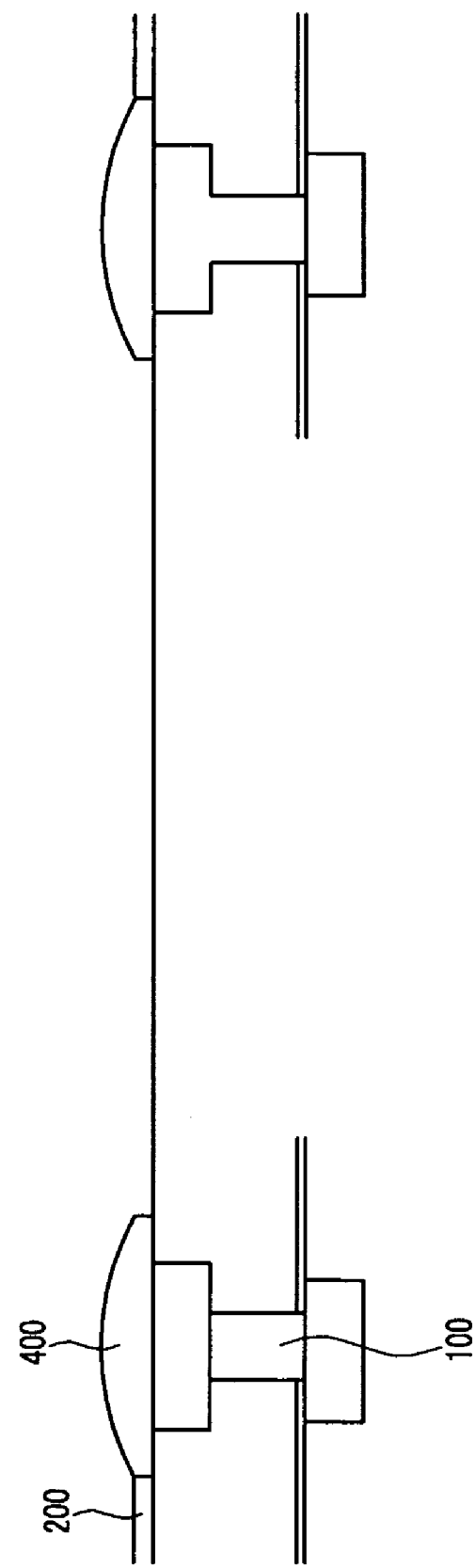

Subsequently, a selective metal layer 400 is selectively deposited on a portion of a metal line exposed by etching the first insulation layer 200. As shown in FIG. 4, the selective metal layer 400 is formed widely enough to fully cover an interconnecting part of the lower metal line, namely the via hole. The selective metal layer may be composed of W, Ti, TiN, Ta, or TaN for selective deposition.

Figure 5:
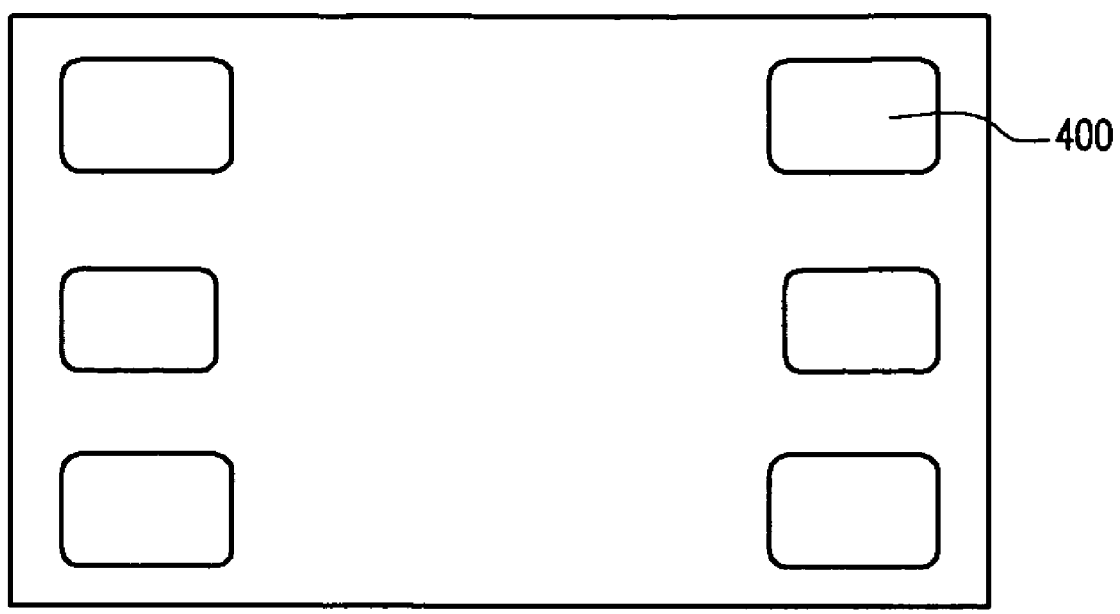

FIG. 5 is a top-plan view showing the selective metal layer 400 which is selectively deposited on the semiconductor device.

The selective metal layer 400 formed on a metal line, especially when the metal line is a copper line, can protect the metal line from moisture which penetrates into the metal line through a blowing part created in the subsequent blowing process for a fuse part. In addition, the selective metal layer 400 may enhance yield of semiconductor devices because it prevents a failure of a PCT (Pressure Cooker Test) which is one of reliability tests by preventing effects on the metal line caused by a blowing process for a fuse part.

Figure 6:
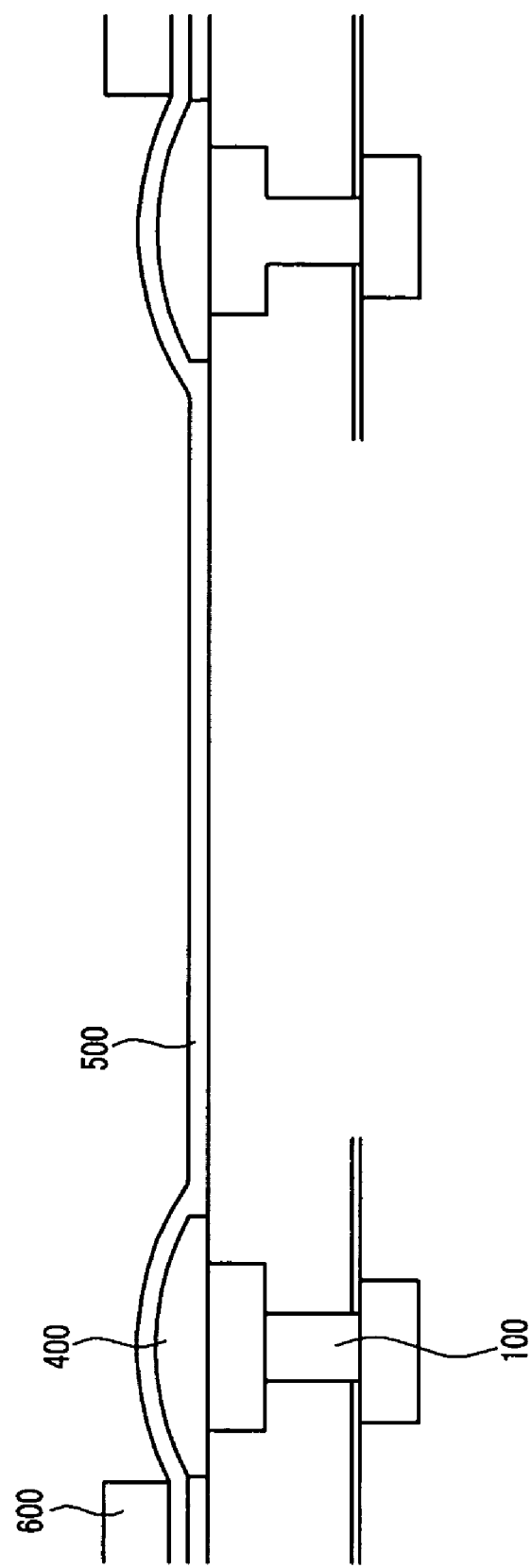

As shown in FIG. 6, a fuse metal layer 500 is formed on the selective metal layer 400 and semiconductor device. The fuse metal layer 500 may be composed of Ti, TiN, Ta, or TaN.

Subsequently, a photosensitive layer pattern 600 for forming a fuse is formed on the fuse metal layer 500.

Figure 7:
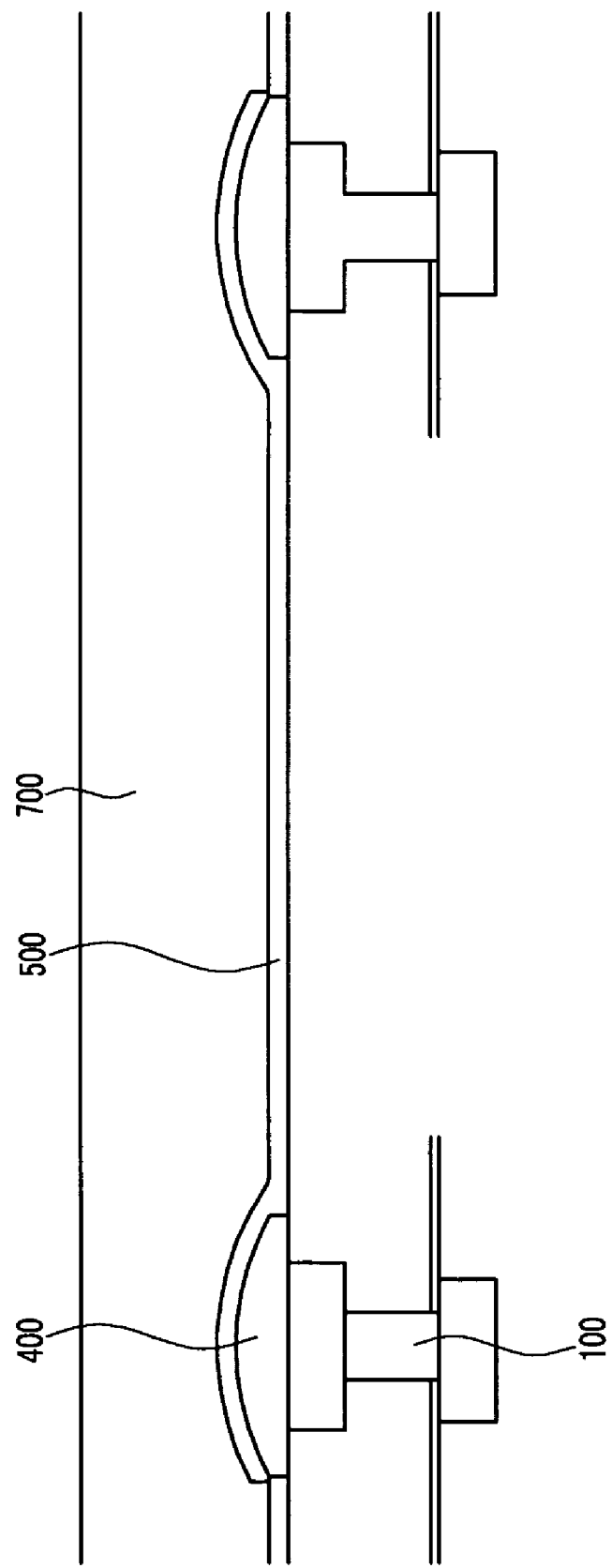
Figure 8:
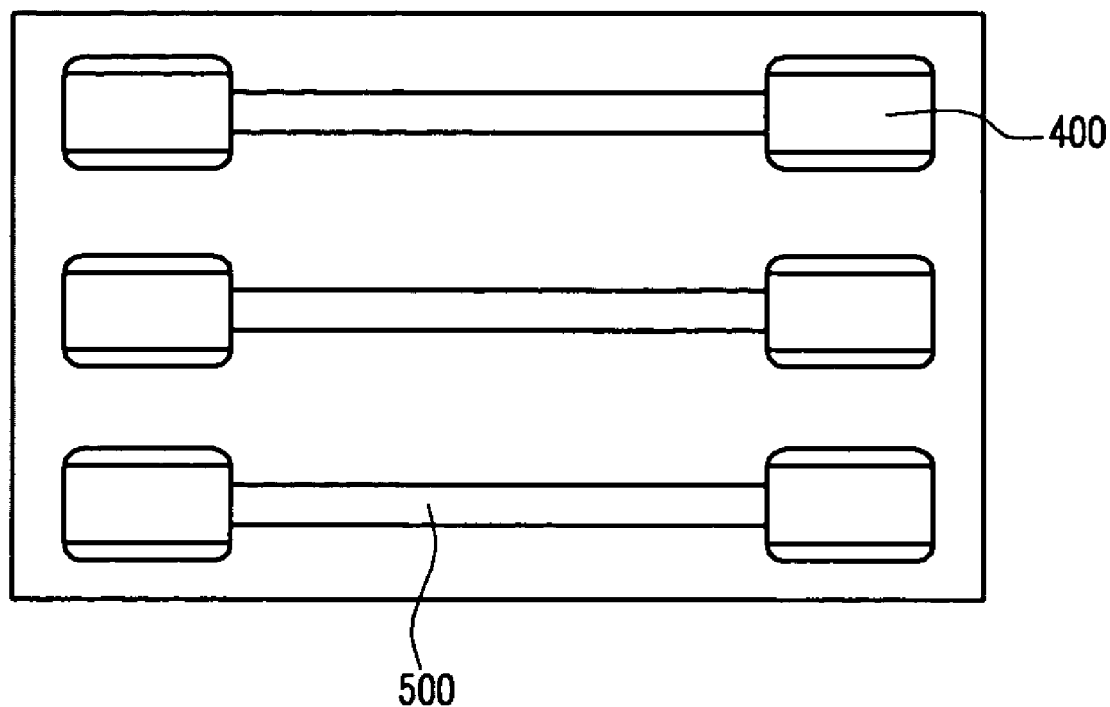

As shown in FIG. 7, a fuse metal layer pattern is formed by using the photosensitive layer pattern 600 for forming a fuse as an etch mask. FIG. 8 is a top plan view showing the fuse metal layer pattern etched by using the photosensitive layer pattern 600 for forming a fuse.

Thereafter, a second insulation layer 700 is thickly deposited on the fuse metal layer 500. The second insulation layer is used as a passivation layer for the semiconductor device.

The fuse metal layer 500 and the interconnecting part of the lower metal line, namely the via hole, are not directly connected to each other, but are connected through the selective metal layer 400. Therefore, a short circuit between the fuse metal layer 500 and the lower metal line may be prevented because moisture cannot penetrate into the metal line through the fuse metal layer or because effects on the metal line caused by the blowing process for a fuse part are prevented.

Figure 9:
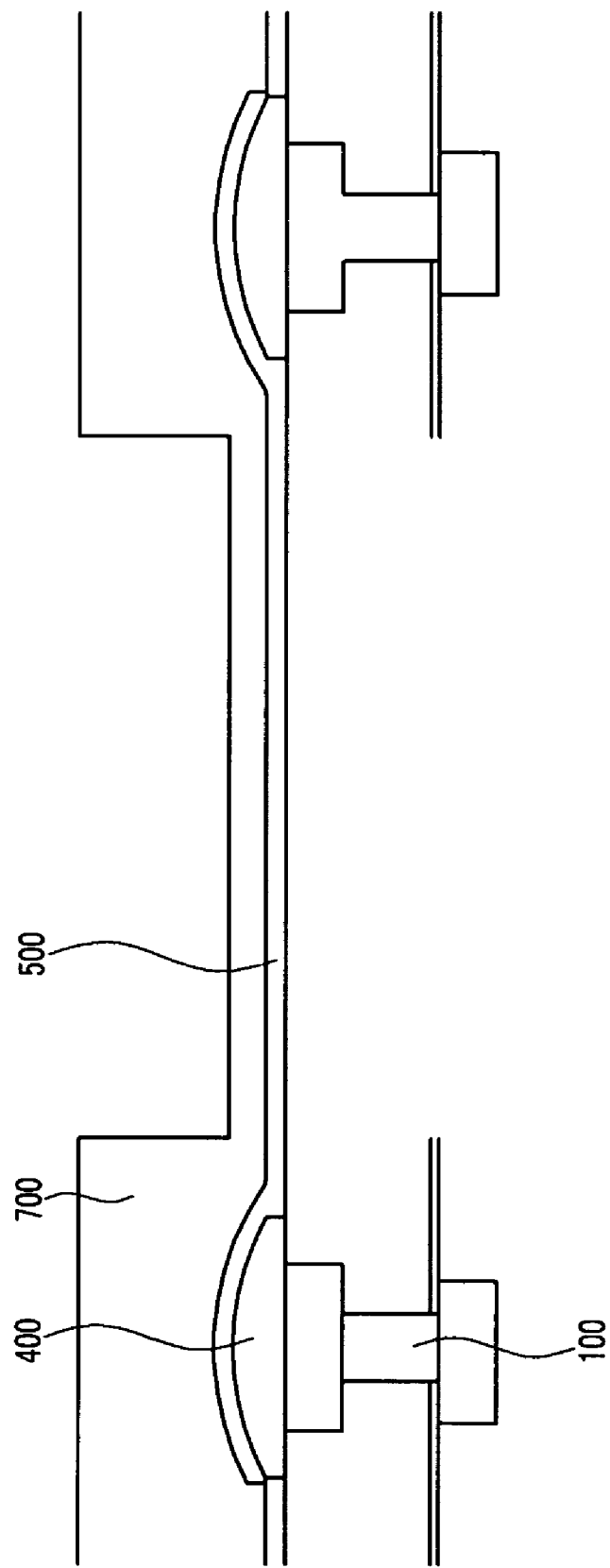
Figure 10:
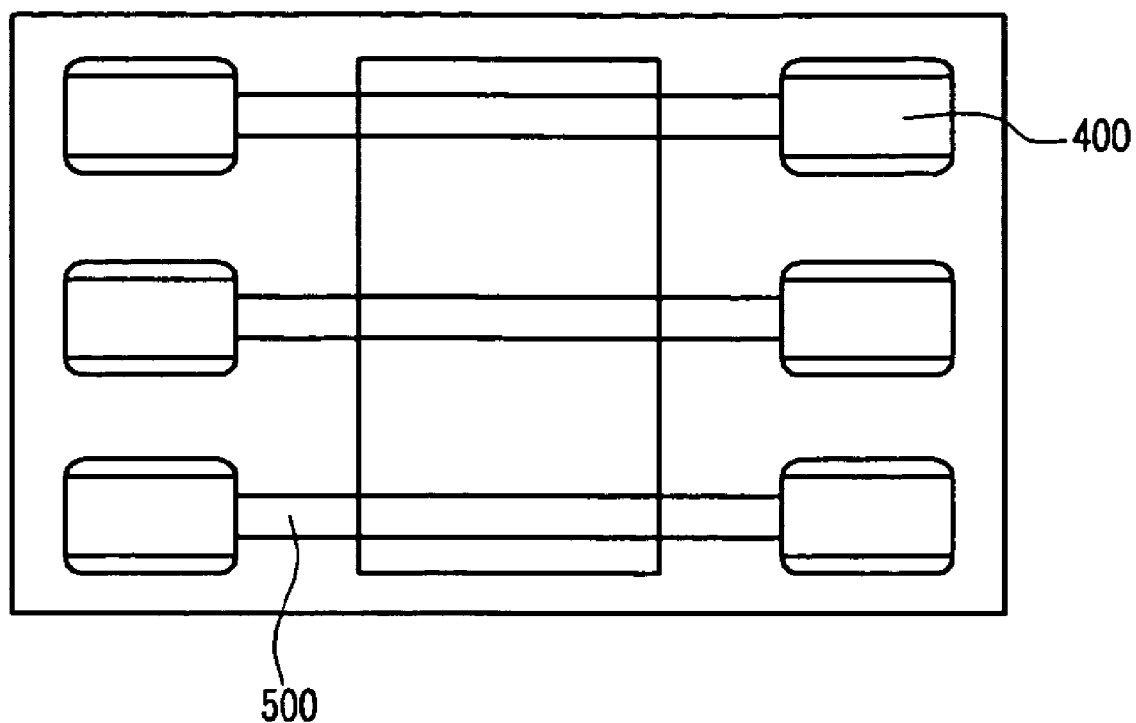

As shown in FIG. 9, a fuse is finally formed by etching the second insulation layer 700 with the use of a mask on the second insulation layer 700 to a degree that a portion of the second insulation layer 700 having a predetermined thickness is left on the fuse metal layer 500. FIG. 10 is a top plan view showing a fuse pattern formed by etching the second insulation layer 700.

Hereinafter, a semiconductor device with a fuse part manufactured by the second exemplary embodiment of the present invention will be described with reference to FIG. 11.

Figure 11:
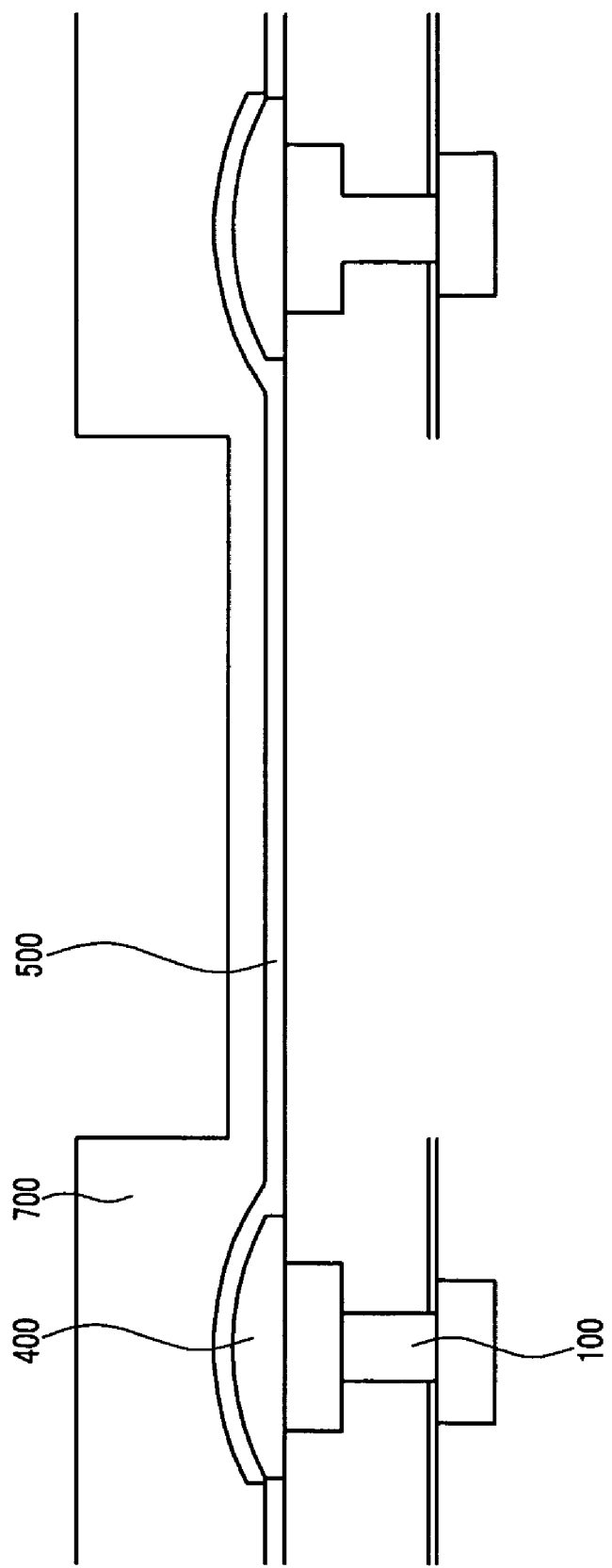
FIG. 11 is a cross-sectional view showing a semiconductor device manufactured by a second exemplary embodiment of the present invention.

As shown in FIG. 11, a typical example of a semiconductor device with a fuse part manufactured by the second exemplary embodiment of the present invention is a semiconductor device with a fuse part formed by a method of forming a fuse part in a semiconductor device according to the first exemplary embodiment of the present invention.

According to the second exemplary embodiment of the present invention, a via hole connected to metal lines is formed on a lower part of a semiconductor device, and a selective metal layer 400, fuse metal layer 500, and insulation layer 700 are formed in the semiconductor device.

As shown in FIG. 9, a metal line 100 in the second exemplary embodiment of the present invention is formed by using a dual damascene process.

When etching and ashing processes are performed for forming a fuse, the selective metal layer 400 may minimize the effects of those processes on the metal layer 400 which is located below the selective metal layer 400. In addition, the selective metal layer 400 needs to be formed widely enough to fully cover the interconnecting part of the lower metal line.

The selective metal layer 400 is selectively deposited, and it is composed of W, Ti, TiN, Ta, or TaN for selective deposition.

According to the second exemplary embodiment of the present invention, the fuse metal layer 500 is used as a metal layer for forming a fuse part, and it is formed on the selective metal layer 400. In addition, adjacent selective metal layers 400 are connected to each other by the fuse metal layer 500. The fuse metal layer is also composed of Ti, TiN, Ta, or TaN.

The insulation layer 700 is thinly formed on the fuse metal layer 500 in order to form a fuse part, and it has protrusions and depressions toward the fuse metal layer 500.

As described above, since a selective metal layer is formed to fully cover a via hole connected to a metal line, moisture cannot penetrate into the metal line through a fuse metal layer during a blowing process for forming a fuse. Therefore, copper corrosion caused by the penetration of the moisture can be prevented. In addition, a selective metal layer may enhance reliability and yield of a semiconductor device because it prevents a failure of a PCT (Pressure Cooker Test), which is one of reliability tests.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of forming a fuse part in a semiconductor device, comprising:

forming a selective metal layer on a via hole which is connected to a metal line in a semiconductor device, wherein the selective metal layer completely covers the via hole and the metal line;

forming a fuse metal layer on the selective metal layer, the fuse metal layer electrically connecting at least two metal lines with each other, wherein the at least two metal lines are located in a same layer; and forming a fuse metal layer pattern by using a photosensitive layer pattern which is formed on the fuse metal layer.

2. The method of claim 1, wherein the metal line is formed by a dual damascene process.

3. The method of claim 1, wherein the selective metal layer is composed of W, Ti, TiN, Ta, or TaN.

4. The method of claim 1, wherein the fuse metal layer is composed of Ti, TiN, Ta, or TaN.

5. The method of claim 1, wherein the metal line and the fuse metal layer are connected to each other through the selective metal layer.

6. A method of forming a fuse part in a semiconductor device, comprising:

forming a first insulation layer on a metal line in a semiconductor device;

forming a first photosensitive layer pattern on the first insulation layer in order to form a fuse part;

etching the first insulation layer by using the first photosensitive layer pattern to a degree that the metal line is exposed;

selectively forming a selective metal layer on the exposed metal line, wherein the selective metal layer completely covers an interconnecting part between the metal line and the fuse metal layer and the metal line;

forming a fuse metal layer on the selective metal layer, the fuse metal layer electrically connecting at least two metal lines with each other, wherein the at least two metal lines are located in a same layer;

forming a fuse metal layer pattern by using a second photosensitive layer pattern which is formed on the fuse metal layer; and forming a second metal insulation layer on the fuse metal layer pattern.

7. The method of claim 6, wherein the first insulation layer is formed as a nitride- or oxide-based layer.

8. The method of claim 7, wherein the selective metal layer is composed of W, Ti, TiN, Ta, or TaN.

9. The method of claim 6, wherein the fuse metal layer is composed of Ti, TiN, Ta, or TaN.

10. The method of claim 6, wherein the metal line and fuse metal layer are connected to each other through the selective metal layer.

* * * * *